United States Patent
Tsai et al.

(10) Patent No.: US 7,180,183 B2
(45) Date of Patent: Feb. 20, 2007

(54) SEMICONDUCTOR DEVICE WITH REINFORCED UNDER-SUPPORT STRUCTURE AND METHOD OF FABRICATING THE SAME

(75) Inventors: Ho-Yi Tsai, Taichung (TW);
Chin-Ming Shih, Taichung (TW);
Ying-Ren Lin, Taichung (TW)

(73) Assignee: Siliconware Precision Industries Co., Ltd. (TW)

( * ) Notice: Subject to any disclaimer, the term of this patent is extended or adjusted under 35 U.S.C. 154(b) by 383 days.

(21) Appl. No.: 10/441,677

(22) Filed: May 19, 2003

(65) Prior Publication Data
US 2004/0080043 A1    Apr. 29, 2004

(30) Foreign Application Priority Data
Oct. 25, 2002    (TW) ................................. 91125177 A

(51) Int. Cl.
*H01L 23/48* (2006.01)
(52) U.S. Cl. ........................................ 257/737; 438/108
(58) Field of Classification Search ................ 257/737, 257/738, 778, 779, 786, 772; 438/108, 613
See application file for complete search history.

(56) References Cited
U.S. PATENT DOCUMENTS 5,381,307 A    1/1995  Hertz et al. .................. 361/767
5,641,946 A *  6/1997  Shim ........................... 174/261
6,020,633 A    2/2000  Erickson ...................... 257/723
6,316,735 B1 * 11/2001  Higashiguchi ............... 174/260
6,444,563 B1 * 9/2002  Potter et al. ................. 438/615

FOREIGN PATENT DOCUMENTS
JP    11-111768    4/1999

* cited by examiner

*Primary Examiner*—Roy Karl Potter
(74) *Attorney, Agent, or Firm*—Peter F. Corless; Steven M. Jensen; Edwards Angell Palmer & Dodge LLP

(57) ABSTRACT

A semiconductor device with reinforced under-support structure and a method for fabricating the semiconductor device are provided, which can be used in the packaging of an MPBGA/TFBGA (Multi-Package Ball Grid Array & Thin Fine-pitch Ball Grid Array) module to help reinforce the TFBGA under-support structure therein. The proposed chip-packaging method is characterized by the provision of large-area solder pads at the corners of a solder-pad array used for TFBGA attaching application, in order to form solder bumps of a large cross section and volume during reflow process to help reinforce the TFBGA under-package structure. This feature can reinforce the TFBGA under-package structure without having to use flip-chip underfill technology, and without having to use extra large type solder balls and arrange pads into different pitches as in the prior art.

19 Claims, 4 Drawing Sheets

SEMICONDUCTOR DEVICE WITH REINFORCED UNDER-SUPPORT STRUCTURE AND METHOD OF FABRICATING THE SAME

BACKGROUND OF THE INVENTION

1. Field of the Invention

This invention relates to semiconductor packaging technology, and more particularly, to a semiconductor device with reinforced under-support structure and method of fabricating the same, which can be used in the fabrication of a semiconductor device, such as a MPBGA (Multi-Package Ball Grid Array) device having at least one TFBGA (Thin Fine-pitch Ball Grid Array) package to help reinforce the TFBGA package's under-support structure and thereby prevent the TFBGA package against stress damage, or can be used in the fabrication of a semiconductor device having a flip-chip structure to reinforce the flip-chip structure.

2. Description of Related Art

MPBGA (Multi-Package Ball Grid Array) is an advanced type of semiconductor device packaging technology, which can be used to pack two or more packages on one single substrate, so as to allow one single semiconductor device to offer a manifold level of functionality or data storage capacity. A graphic control unit, for instance, is typically designed in such a manner as to include a graphic control chip package together with one or more memory chip packages on the same substrate, so as to allow one semiconductor device to offer all the required graphic control functionality without having to be attached to external memory modules.

FIGS. 1A–1B are schematic diagrams showing the architecture of a conventional MPBGA semiconductor device. As shown, this MPBGA semiconductor device is constructed on a substrate 100 for the packaging of three packages: a first package 110, a second package 120, and a third package 130, wherein the first package 110 and the second package 120 are each, for example, a TFBGA (Thin Fine-pitch Ball Grid Array) type of memory chip package, while the third package 130 is for example a graphic control chip package. In this MPBGA semiconductor device, the first package 110 and the second package 120 are mounted on the substrate 100 by means of an array of solder bumps 111 (FIG. 1B only shows the under-support structure of the first package 110). By contrast, the third package 130 is electrically connected to the substrate 100 by means of bonding wires 131 and further encapsulated in a molded encapsulation body 132. Finally, the MPBGA semi-conductor device is mounted by means of solder balls 140 (i.e., ball grid array) to an external printed circuit board 150.

As the first package 110 and the second package 120 are bonded in position over the substrate 100, however, a gap would be undesirably left between each TFBGA package (FIG. 1B only shows the first package 110) and its underlying surface, which, if not underfilled, would easily cause the under-support structure to suffer from fatigue cracking and electrical failure due to thermal stress when the entire semiconductor device is being subjected to high-temperature conditions. As a solution to this problem, it is an essential step in the fabrication process to fill an underfill material, such as epoxy resin, into the under-package gap to form an underfill layer 112 which, when hardened, can serve as a mechanical reinforcement for the under-support structure of the first package 110 to cope against thermal stress.

One drawback to the fabrication of the underfill layer 112, however, is that it would require a highly complex process to achieve, which is quite laborious and time-consuming, making the overall packaging process quite cost-ineffective.

Related art includes, for example, the following patents:

U.S. Pat. No. 6,020,633 "INTEGRATED CIRCUIT PACKAGED FOR RECEIVING ANOTHER INTEGRATED CIRCUIT";

U.S. Pat. No. 5,381,307 "SELF-ALIGNING ELECTRICAL CONTACT ARRAY"; and

Japanese Patent JP 11111768 "MANUFACTURE OF SEMICONDUCTOR DEVICE".

The U.S. Pat. No. 6,020,633 discloses a special type of MPBGA module structure. One drawback to this patent, however, is that it still utilizes under-fill technology to form an underfill layer for reinforcing the under-support structure of the TFBGA package on the substrate, so that it still has the above-mentioned drawbacks of the underfill method.

The U.S. Pat. No. 5,381,307 discloses the use of a specially-designed solder-pad array that includes large-size solder balls at the corners thereof to help align the package in position during reflow process, and can additionally help reinforce under-support structure. One drawback to this patent, however, is that it requires an increase in the number of pads on the substrate, thus undesirably making the overall layout design work more complex and laborious to implement. In addition, for TFBGA (Thin Fine-pitch Ball Grid Array) packages whose ball pitch thereof is below 0.75 mm, the provision of large-size solder balls at corners requires the solder balls to be laid at different ball pitches to prevent these solder balls to come in touch with each other and result in the bridging therebetween.

Japanese Patent JP 11111768 discloses a semiconductor device fabrication method that is characterized by the application of an adhesive agent at the corners to help reinforce under-support structure. One drawback to this solution, however, is that it requires a complex process to implement and is thus quite cost-ineffective.

There exists therefore a need for a new semiconductor device packaging technology that can help reinforce under-support structure without having to use underfill technology for the purpose of allowing the overall fabrication process to be more simplified and cost-effective to implement.

SUMMARY OF THE INVENTION

It is therefore an objective of this invention to provide a new semiconductor device and method that can help reinforce TFBGA under-support structure without having to use underfill technology for the purpose of allowing the overall fabrication process to be more simplified and cost-effective to implement than prior art.

It is another objective of this invention to provide a new semiconductor device and method that can help reinforce the TFBGA under-support structure without having to increase the number of pads on the substrate so as to allow the layout work more simplified than prior art, The semiconductor device with reinforced under-support structure according to the invention comprises: a substrate, which is formed with at least one device mounting area having a solder-pad array therein; the solder-pad array having a plurality of solder pads, with corner-located solder pads being greater in area than those solder pads elsewhere; and at least one electronic component, which is mounted by means of solder joints on the solder-pad array to the device mounting area on the substrate.

The method according to the invention for fabricating a semiconductor device with reinforced under-support structure comprises the steps of preparing a substrate; wherein the substrate is formed with at least one device mounting area having a solder-pad array therein; wherein the solder-pad array is a polygonally-shaped solder-pad array having a plurality of first-type solder pads and a plurality of second-type solder pads, and wherein the first-type solder pads are positioned at the corners of the solder-pad array and are dimensioned to be greater in surface area than the second-type solder pads; pasting a solder material over the first-type solder pads and the second-type solder pads in the solder-pad array to thereby form a group of first-type solder bumps over the first-type solder pads and a group of second-type solder bumps over the second-type solder pads in the solder-pad array, and wherein the first-type solder bumps are greater in cross area and volume than the second-type solder bumps; and performing an SMT process to mount an electronic component onto the substrate by means of the first-type solder bumps and the second-type solder bumps.

The semiconductor packaging technology according to the invention is characterized by the provision of large-area solder pads at the corners of a solder-pad array, which can help to form solder bumps of a large cross section and volume during reflow process to thereby reinforce the TFBGA under-support structure. Compared to the prior art, the semiconductor device and method according to the invention can help reinforce the TFBGA under-support structure in an MPBGA semiconductor device without having to use under-fill technology, and therefore the invention allows the overall process to be more simplified and cost-effective to implement than prior art. Moreover, since the semiconductor device and method according to the invention can be implemented without having to increase the number of pads on substrate, it allows the layout work more simplified than prior art.

BRIEF DESCRIPTION OF DRAWINGS

The invention can be more fully understood by reading the following detailed description of the preferred embodiments, with reference made to the accompanying drawings, wherein.

DESCRIPTION OF PREFERRED EMBODIMENTS

Figure 1A:
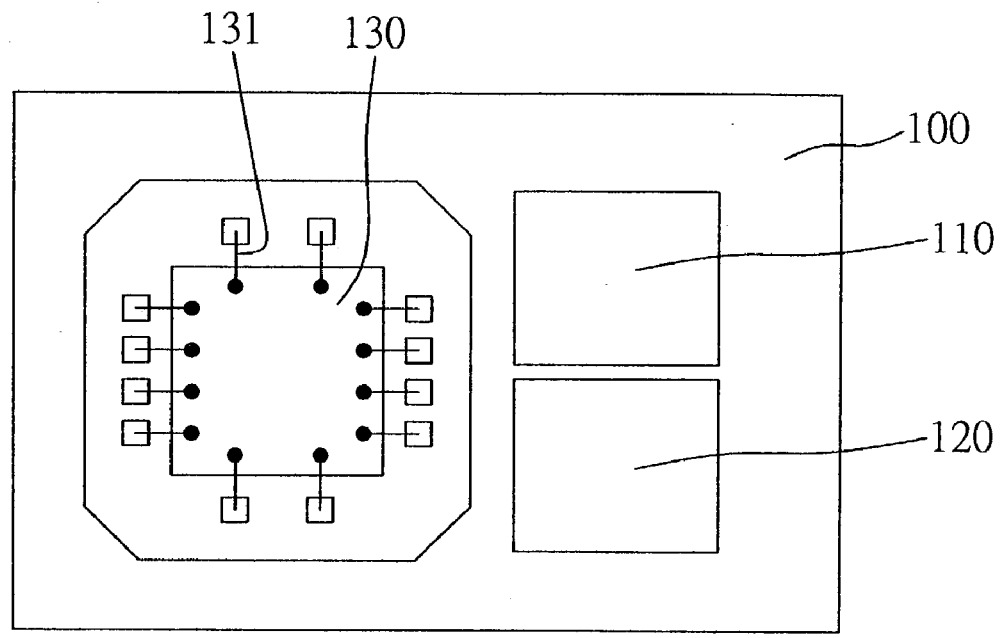
FIG. 1A (PRIOR ART) is a schematic diagram showing the top view of a conventional MPBGA semiconductor device.
Figure 1B:
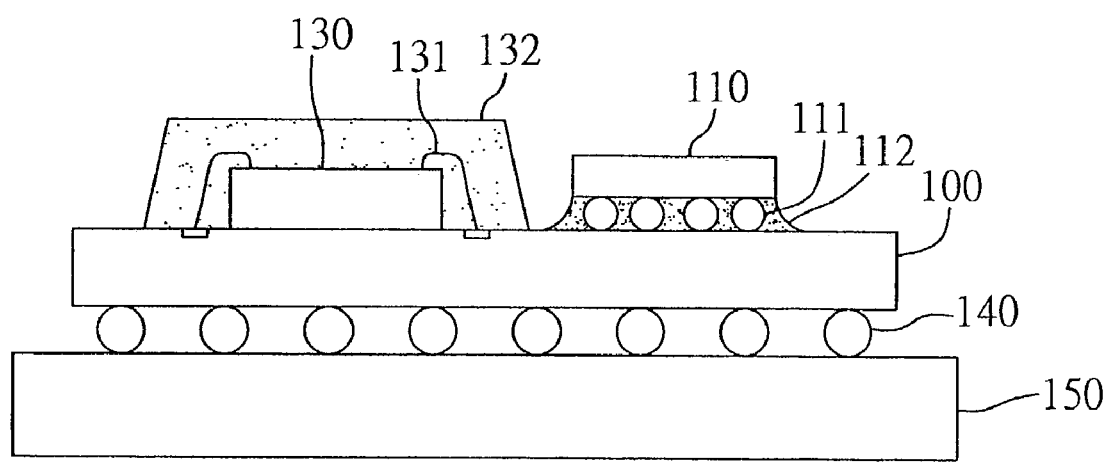
FIG. 1B (PRIOR ART) is a schematic diagram showing a sectional view of the MPBGA semiconductor device of FIG. 1B.
Figure 2A:
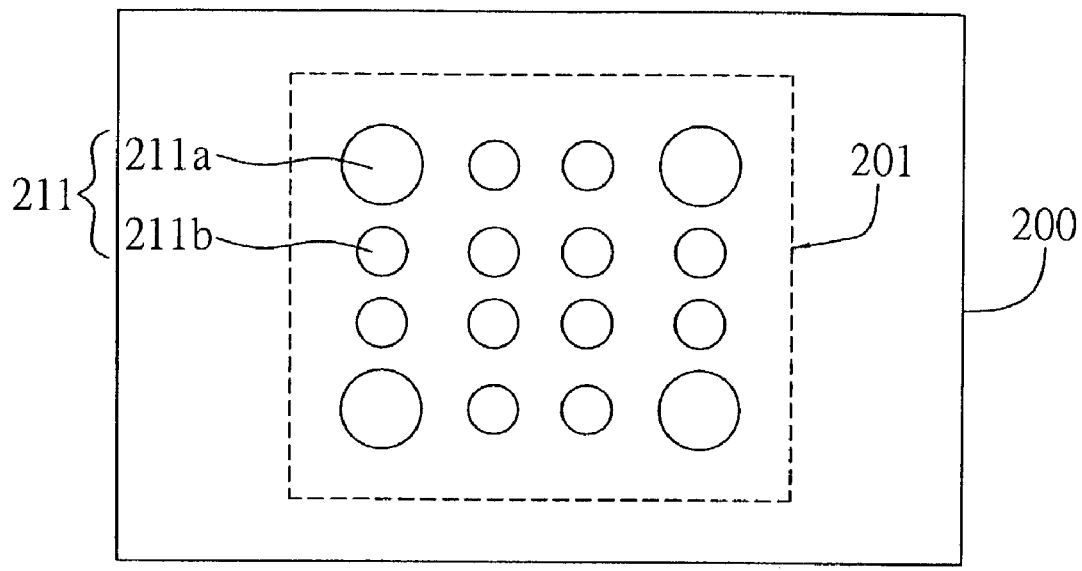
FIG. 2A a schematic diagram showing the top view of a substrate utilized by the semiconductor device and method of the invention, FIG. 2B a schematic sectional diagram showing the semiconductor device of the invention, FIG. 3A a schematic diagram showing a top view of a MPBGA semiconductor device that utilizes the packaging structure of the invention, FIG. 3B a schematic diagram showing a sectional view of the MPBGA semiconductor device that utilizes the packaging structure of the invention
Figure 2B:
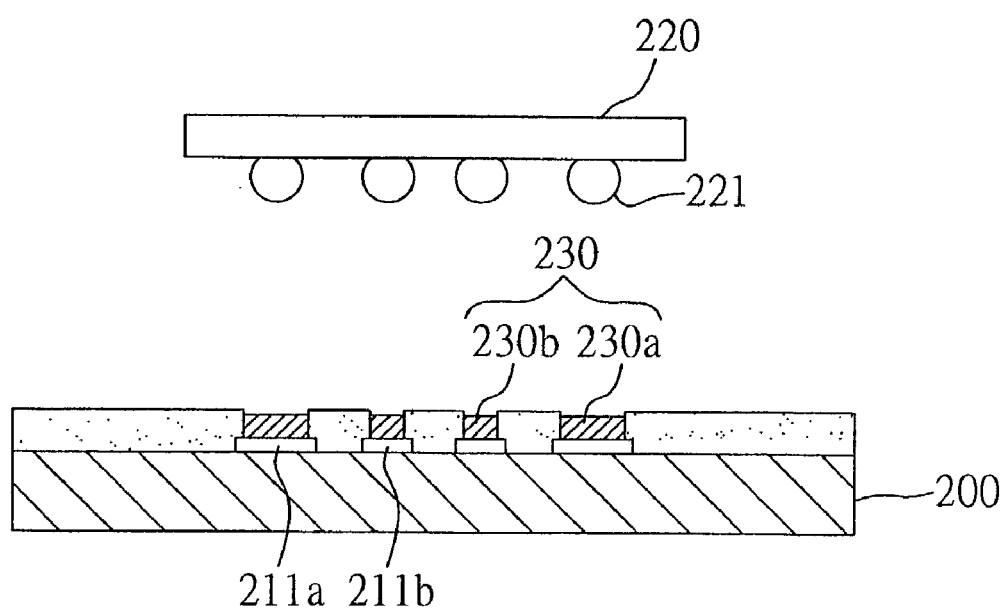

Referring to FIG. 2A and FIG. 2B, the semiconductor device with reinforced under-support structure according to the invention comprises a substrate 200 and at least one electronic component 220, wherein the substrate 200 is formed with at least one device mounting area 201 on one surface thereof and a solder-pad array 211 formed within the device mounting area 201, while the electronic component 220 is provided with a plurality of solder bumps 221 for mechanically bonding and electrically coupling the electronic component 220 to the substrate 200.

The solder-pad array 211 formed within the device mounting area 201 on the substrate 200 is composed of a plurality of first-type solder pads 211a and a plurality of second-type solder pads 211b, wherein the first-type solder pads 211a are arranged on the corners of the solder-pad array 211, and which are greater in area than the second-type solder pads 211b. Moreover, the solder-pad array 211 is implanted with a solder-bump array 230, which is composed of a plurality of first-type solder bumps 230a and a plurality of second-type solder bumps 230b; wherein the first-type solder bumps 230a are greater in area than the second-type solder bumps 230b; and wherein the first-type solder bumps 230a are implanted respectively on the first-type solder pads 211a, while the second-type solder bumps 230b are implanted respectively on the second-type solder pads 211b.

Note that FIGS. 2A–2B are simplified schematic diagrams to show only those parts related to the invention; and the shown parts are not drawn to actual scale, size, and number, which can be arbitrary design choices in the actual implementation of the invention.

Figure 4A:
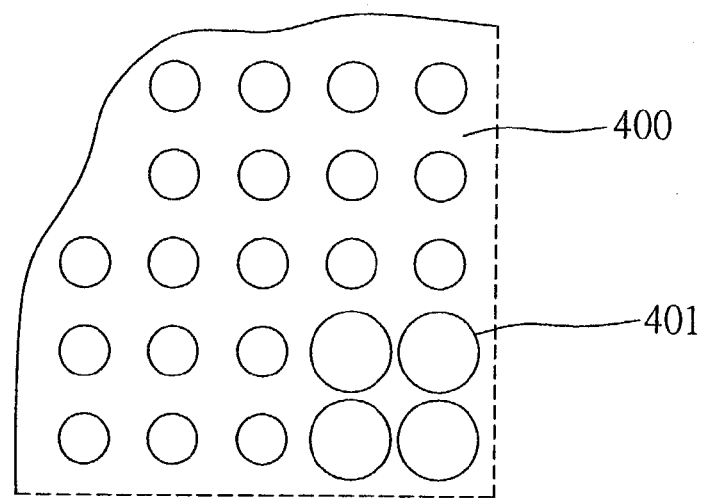
FIGS. 4A–4C are schematic diagrams showing various other embodiments of the semiconductor device and method according to the invention.
Figure 4B:
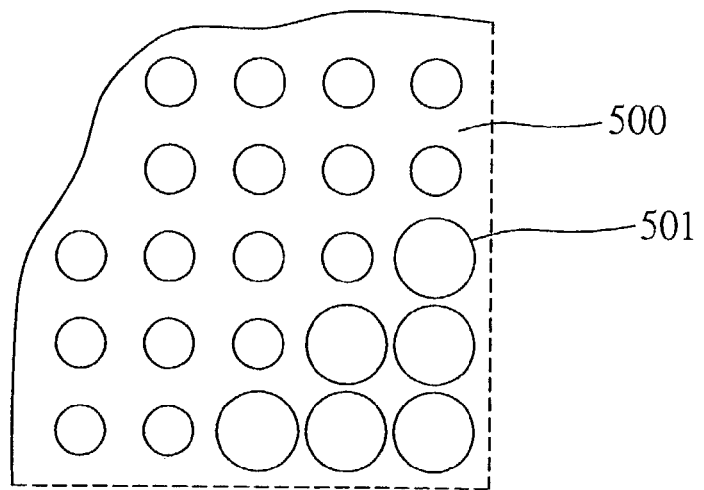
Figure 4C:
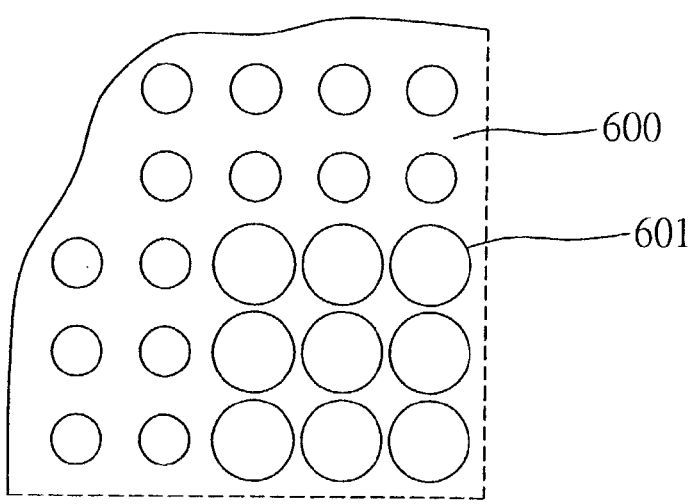

FIGS. 4A–4C are schematic diagrams showing(, various other embodiments of the aforementioned solder-pad array 211 in actual implementation of the invention; wherein FIG. 4A shows an example of an solder-pad array 400 having four large-area first-type solder pads 401 at each corner (only one corner is shown); FIG. 4B shows an example of the solder-pad array 500 having six large-area first-type solder pads 501 at each corner (only one corner is shown); and FIG. 4C shows an example of an solder-pad array 600 having nine large-area first-type solder pads 601 at each corner (only one corner is shown). Various other embodiments are still possible. Fundamentally, the number of size of the solder pads are not limited to these preferred embodiments, and the key point of the invention is that the corner-located solder pads should be greater in area than those solder pads that are located elsewhere.

As shown in FIG. 2B, the electronic component 220 can be, for example, a BGA package or a flip-chip package, and which is solder-jointed by means of the solder-pad array 211 through solder balls or bumps to the first-type solder bumps 230a and the second-type solder bumps 230b to thereby be mechanically bonded and electrically connected to the substrate 200.

The method for fabricating a semiconductor device according to the invention is described below.

In the method according to the invention, the first step is to prepare a substrate 200 which is formed with at least one device mounting area 201 on one surface thereof and a solder-pad array 211 formed within the device mounting area 201, and wherein the solder-pad array 211 is composed of a plurality of first-type solder pads 211a and a plurality of second-type solder-pads 211b, wherein the first-type solder pads 211a are arranged on the corners of the solder-pad array 211, and which are greater in area than the second-type solder pads 211b.

In the next step, a solder substance is pasted onto the first-type solder pads 211a and the second-type solder pads 211b to thereby form a solder-bump array 230 thereon, which is composed of a plurality of first-type solder bumps 230a and a plurality of second-type solder bumps 230b;

wherein the first-type solder bumps 230a are greater in area than the second-type solder bumps 230b.

In the next step, an electronic component 220 is mechanically bonded and electrically connected to the substrate 200 by means of bonding the solder bumps 221 to the first-type solder bumps 230a and the second-type solder bumps 230b.

Figure 3A:
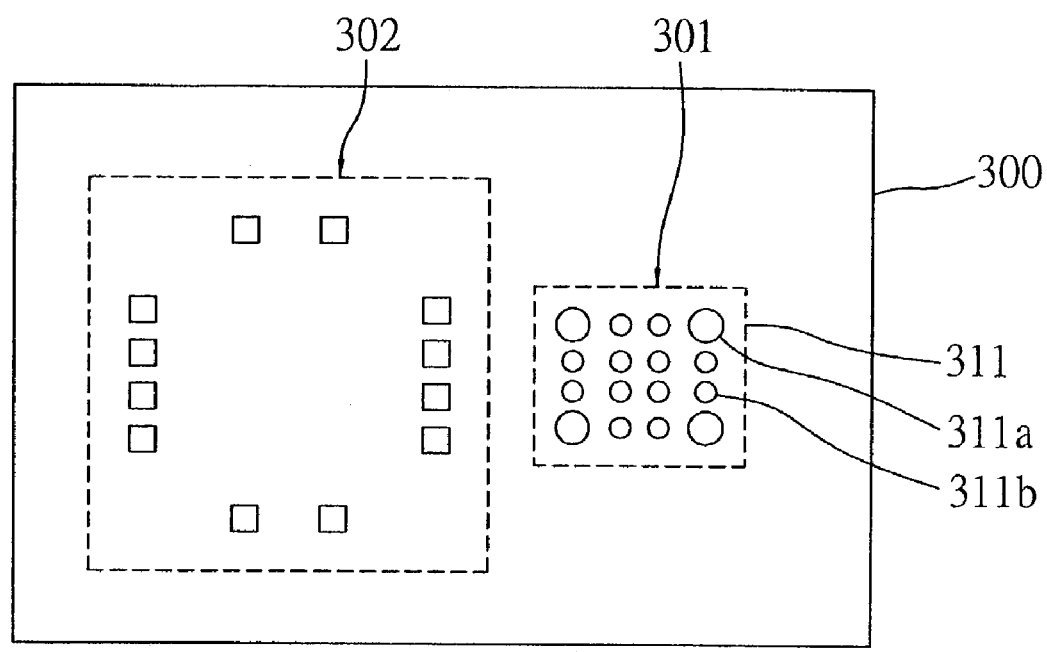
Figure 3B:
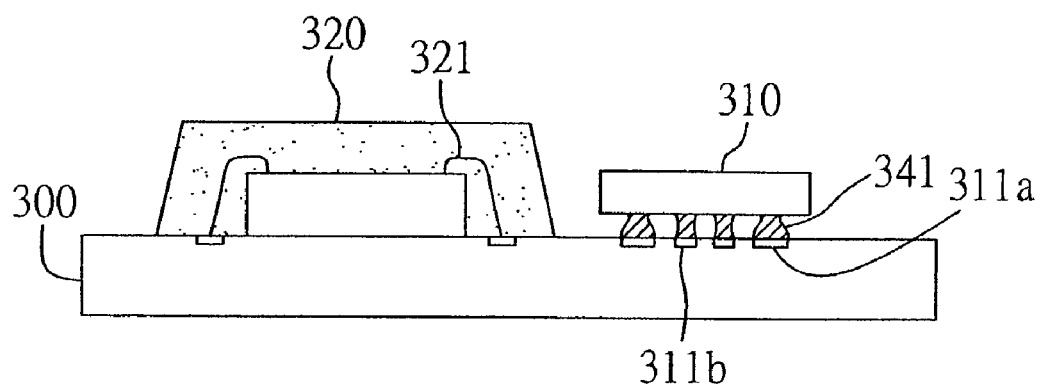

Referring to FIG. 3A and FIG. 3B, in the following preferred embodiments, the semiconductor device and method of the invention is utilized in the fabrication of a MPBGA (Multi-Package Ball Grid Array) semiconductor device with the purpose of reinforcing the TFBGA (Thin Fine-pitch Ball Grid Array) package's under-support structure therein. However, broadly speaking, the invention can also be used to reinforce a flip chip's under-support structure for the flip chip to be more robust to cope against thermal stress.

As shown, the substrate 300 is used to mount two packages: a first package 310 and a second package 320; wherein the first package 310 is, for example, a TFBGA memory chip package, while the second package 320 is for example a graphic control chip package. Moreover, the first package 310 can be either a WB-TFBGA (Wire-Bonded TFBGA) package, or a FC-TFBGA (Flip-Chip TFBGA) package. To mount these two packages 310, 320, the substrate 300 is provided with a first device mounting area 301 and a second device mounting area 302. Further, the first device mounting area 301 and the second device mounting area, 302 are each provided with a polygonally-shaped solder-pad array, such as a rectangularly-shaped solder-pad array 311.

The invention is characterized by arranging the solder-pad array 311 into a subgroup of large-area first-type solder pads 311a and a subgroup of small-area second-type solder pads 311b, wherein the large-area first-type solder pads 311a are positioned at the four corners of the solder-pad array 311.

As shown in FIG. 3B, during package-mounting process, the two packages 310, 320 are mounted respectively over the first mounting area 301 and the second mounting area 302 on the substrate 300. The first package 310 is mounted onto the first mounting area 301 by, for example, a first step of pasting a solder material through the use of, for example, stencil-printing technology, over the solder-pad array 311 to thereby form a plurality of first-type solder bumps (not shown) over the first-type solder pads 311a in the solder-pad array 311 and meanwhile a plurality of second-type solder bumps (not shown) over the second-type solder pads 311b in the solder-pad array 311. Since the first-type solder pads 311a are greater in surface area than the second-type solder pads 311b, the resulted first-type solder bumps are greater in cross area and volume than the second-type solder bumps.

In the next step, a SMT (Surface-Mount Technology) is performed to mount the first package 310 over the first mounting area 301; and then a reflow process is performed to reflow the first-type solder bumps to form solder joint 341 for mechanically bonding and electrically connecting the first package 310 to the substrate 300.

On the other hand, the second package 320 is mounted in the same manner as prior art, i.e., electrically connected to the substrate 300 by means of bonding wires 321, such as gold wires, to the second device mounting area 302. Description thereof will not be further detailed herein.

It is known that the weakest points on TFBGA under-support structure in an MPBGA semiconductor device are at the four corners of the TFBGA under-support structure. For this sake, the invention is specifically intended for forming large-size solder joints 341 at the four corners of the TFBGA package 310 to provide reinforced under-support structure for the TFBGA package 310. Compared to the prior art, the semiconductor device and method according to the invention can help reinforce the TFBGA under-support structure in an MPBGA semiconductor device without having to use flip-clip underfill technology, and therefore the invention allows the overall process to be more simplified and cost-effective to implement than prior art. Moreover, since the semiconductor device and method of the invention can be implemented without having to increase the number of pads on substrate, it allows the layout work more simplified than prior art. The invention is therefore more advantageous to use than the prior art.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A semiconductor device with reinforced wider-support structure, comprising:
   a substrate formed with at least one device mounting area having a solder-pad array therein, the solder-pad array having a plurality of solder pads, with corner-located solder pads being greater in area than those solder pads elsewhere;
   a solder-bump array implanted an the solder-pad array, wherein the solder-bump array is composed of a plurality of first-type solder bumps and a plurality of second-type solder bumps, and the first-type solder bumps are greater in area than the second-type solder bumps; and
   at least one electronic component having a plurality of third-type solder bumps, wherein the electronic component is mounted to the device mounting area on the substrate by bonding the third-type solder bumps to the first-type solder bumps and the second-type solder bumps.

2. The semiconductor device with reinforced under-support structure of claim 1, wherein the solder-pad array is a polygonally-shaped solder-pad array having a plurality of first-type solder pads and a plurality of second-type solder pads; and wherein the first-type solder pads are positioned at the corners of the solder-pad array and are dimensioned to be greater in surface area than the second-type solder pads.

3. The semiconductor device with reinforced under-support structure of claim 2, wherein the first-type solder bumps and the second-type solder bumps are implanted respectively on the first-type solder pads, and the second-type solder pads.

4. The semiconductor device with reinforced under-support structure of claim 1, wherein the electronic component is a TFBGA (Thin Fine-pitch Ball Grid Array) package.

5. The semiconductor device with reinforced under-support structure of claim 4, wherein the TFBGA package is a WB-TFBGA (Wire-Bonded TFBGA) package.

6. The semiconductor device with reinforced under-support structure of claim 4, wherein the TFBGA package is a FC-TFBGA (Flip-Chip TFBGA) package.

7. The semiconductor device with reinforced under-support structure of claim 1, wherein the electronic component is a flip-chip package.

8. A semiconductor device with reinforced under-support structure, comprising:
   a substrate, formed with at least one device mounting area having a solder-pad array therein, wherein the solder-pad array is a polygonally-shaped solder-pad array having a plurality of first-type solder pads and a plurality of second-type solder pads, and wherein the first-type solder pads are positioned at the corners of the solder-pad array and are dimensioned to be greater in surface area than the second-type solder pads;

a solder-bump array, implanted on the solder-pad array and composed of a plurality of first-type solder bumps and a plurality of second-type solder bumps, wherein the first-type solder bumps are greater in area than the second-type solder bumps, and the first-type solder bumps and the second-type solder bumps are implanted respectively on the first-type solder pads, and the second-type solder pads; and at least one electronic component having a plurality of third-type solder bumps, wherein the electronic component is mounted by means of solder joints on the solder-pad array to the device mounting area on the substrate.

9. The semiconductor device with reinforced under-support structure of claim 8, wherein the electronic component is a TFBGA package.

10. The semiconductor device with reinforced under-support structure of claim 9, wherein the TFBGA package is a WB-TFBGA package.

11. The semiconductor device with reinforced under-support structure of claim 9, wherein the TFBGA package is a FC-TFBGA package.

12. The semiconductor device with reinforced under-support structure of claim 8, wherein the electronic component is a flip-chip package.

13. A semiconductor device packaging method, which comprises the steps of:

preparing a substrate formed with at least one device mounting area having a solder-pad array therein, wherein the solder-pad array is a polygonally-shaped solder-pad array having a plurality of first-type solder pads and a plurality of second-type solder pads; and the first-type solder pads are positioned at the corners of the solder-pad array and are dimensioned to be greater in surface area than the second-type solder pads;

pasting a solder material over the first-type solder pads and the second-type solder pads in the solder-pad array to thereby form a group of first-type solder bumps over the first-type solder pads and a group of second-type solder bumps over the second-type solder pads in the solder-pad array, wherein the first-type solder bumps are greater in cross area and volume than the second-type solder bumps; and performing a SMT (Surface-Mount Technology) process to mount an electronic component having a plurality of third-type solder bumps onto the substrate by means of the first-type solder bumps and the second-type solder bumps.

14. The semiconductor device packaging method of claim 13, wherein a stencil-printing process is performed to paste the solder material to the first-type solder pads and the second-type solder pads in the solder-pad array.

15. The semiconductor device packaging method of claim 13, further comprising a step of: performing a reflow process to reflow the first-type solder bumps and the second-type solder bumps over the first-type solder pads and the second-type solder pads.

16. The semiconductor device packaging method of claim 13, wherein the electronic component is a TFBGA package.

17. The semiconductor device packaging method of claim 16, wherein the TFBGA package is a WB-TFBGA package.

18. The semiconductor device packaging method of claim 16, wherein the TFBGA package is a FC-TFBGA package.

19. The semiconductor device packaging method of claim 13, wherein the electronic component is a flip-chip package.

* * * * *